(12) United States Patent
John et al.

(10) Patent No.: US 7,816,221 B2
(45) Date of Patent: Oct. 19, 2010

(54) DIELECTRIC LEDGE FOR HIGH FREQUENCY DEVICES

(75) Inventors: Jay P. John, Chandler, AZ (US); James A. Kirchgessner, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 12/147,230

(22) Filed: Jun. 26, 2008

(65) Prior Publication Data

US 2009/0321788 A1 Dec. 31, 2009

(51) Int. Cl.
*H01L 21/331* (2006.01)
*H01L 21/8222* (2006.01)

(52) U.S. Cl. .................. 438/309; 438/700; 438/733; 257/E21.17; 257/E21.042; 257/E21.085; 257/E21.092; 257/E21.126; 257/E21.127; 257/E21.182; 257/E21.227; 257/E21.247; 257/E21.248; 257/E21.32; 257/E21.585

(58) Field of Classification Search .................. 438/142, 438/311, 309, 506, 508, 602, 603, 604, 680, 438/700, 733, 769, 752, 753, 933; 257/E21.17, 257/42, 53, 85, 92, 126, 127, 182, 227, 248, 257/247, 32, 585
See application file for complete search history.

(56) References Cited

U.S. PATENT DOCUMENTS

| | | | | |
|---|---|---|---|---|
| 5,118,634 A | * | 6/1992 | Neudeck et al. | 438/341 |
| 5,134,454 A | * | 7/1992 | Neudeck et al. | 257/587 |
| 5,182,225 A | * | 1/1993 | Matthews | 438/202 |
| 5,587,599 A | | 12/1996 | Mahnkopf et al. | |
| 6,239,477 B1 | * | 5/2001 | Johnson | 257/592 |
| 7,190,046 B2 | * | 3/2007 | Akatsu et al. | 257/565 |
| 2003/0020139 A1 | | 1/2003 | Stengl et al. | |

OTHER PUBLICATIONS

Heinemann, B., et al., A low-parasitic collector construction for high-speed SiGe:C HBTs, 0-7803-8684 IEEE, Jan. 2004.
Donkers, J., et al., A novel fully self-aligned SiGe:C HBT architecture featuring a single self-step epitaxial collector-base process, 1-4244-0439 IEEE, Jul. 2007.
PCT Application No. PCT/US2009/038550; Search Report and Written Opinion mailed Sep. 29, 2009.

* cited by examiner

*Primary Examiner*—David Nhu
(74) *Attorney, Agent, or Firm*—Ingrassia, Fisher & Lorenz, P.C.

(57) ABSTRACT

High frequency performance of (e.g., silicon) bipolar devices (40, 100, 100") is improved by reducing the capacitive coupling (Cbc) between the extrinsic base contact (46) and the collector (44, 44', 44"). A dielectric ledge (453, 453') is created during fabrication to separate the extrinsic base contract (46) from the collector (44, 44', 44") periphery (441). The dielectric ledge (453, 453') underlies the transition region (461) where the extrinsic base contact (46) is coupled to the intrinsic base. (472) During device fabrication, a multi layer dielectric stack (45) is formed adjacent the intrinsic base (472) that allows the simultaneous creation of an undercut region (457, 457') in which the intrinsic base (472) to extrinsic base contact (46) transition region (461) can be formed. The transition region (461) formed in the cavity (457, 457') overlies the dielectric ledge (453, 453') which separates it from the collector (44, 44', 44") periphery (441), thereby reducing the base-collector junction capacitance (Cbc). $f_{MAX}$ of the device is significantly increased.

15 Claims, 8 Drawing Sheets

FIG. 19

DIELECTRIC LEDGE FOR HIGH FREQUENCY DEVICES

FIELD OF THE INVENTION

This invention relates generally to semiconductor devices, and more particularly to methods and structures for forming bipolar transistors.

BACKGROUND OF THE INVENTION

For ultra-high frequency operation, e.g., in the 77 GHz auto radar band and above, transistors with very high $f_{MAX}$ (>250 GHz) and low high-frequency noise are needed. Higher frequency bands, e.g., the 94+GHz imaging band, will require even higher performance devices. While semiconductor devices employing III-V compounds are useful in these very high frequency bands, such devices are generally more expensive than is desired. A silicon based solution is desirable for ease of integration with other complex electronic functions and for low cost manufacturing. Self-aligned emitter-base silicon-germanium hetero-junction bipolar transistors (HBTs) are potential candidates for such very high frequency devices, provided that the current device performance limitations can be overcome. For example, the coupling capacitance Cbc between the extrinsic base and the collector region where the extrinsic base connects to the intrinsic base is currently larger than desired and detracts from the overall device performance. Accordingly, a need continues to exist for structures and methods of manufacture of bipolar transistors that avoid or mitigate these and other limitations of the current art.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

Figure 1:
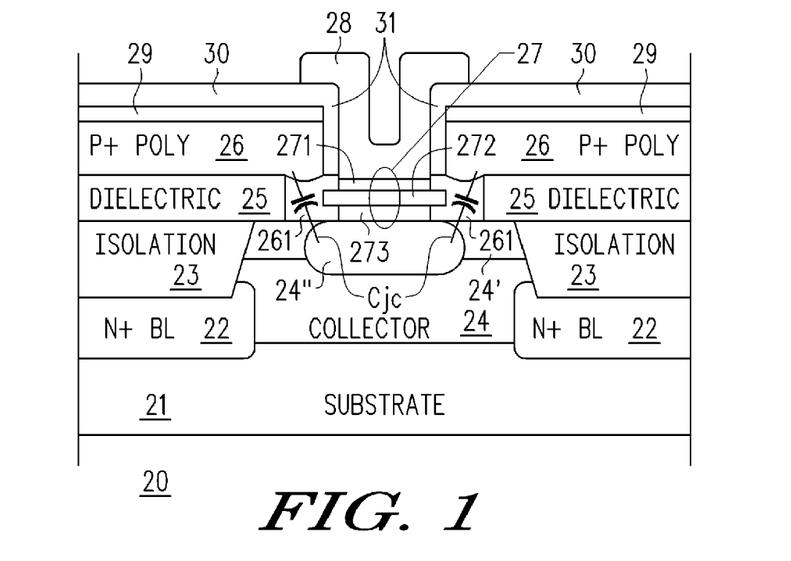
FIG. 1 shows a simplified schematic cross-sectional view of a hetero-junction bipolar transistor illustrating how undesirable base-collector coupling capacitance Cjc can arise.

FIG. 1 shows a simplified schematic cross-sectional view of exemplary hetero-junction bipolar transistor 20 illustrating how undesirable base-collector coupling capacitance Cjc can arise. For convenience of explanation, transistor 20 and later described devices 40, 100, 100', are presumed to be silicon npn-transistors and various semiconductor regions within such devices are identified by way of example based on this assumption. However, this is not intended to be limiting and persons of skill in the art will understand that by appropriate substitution of semiconductor (SC) regions of opposite conductivity type and/or other semiconductor materials, that pnp and other types of semiconductor devices on silicon or substrates other than silicon can be provided according to the teachings herein. Transistor 20 conveniently comprises (e.g., P-type silicon) substrate 21 in which are N+buried layer (BL) regions 22, dielectric isolation regions 23 and N-type collector regions 24, 24', 24". Above collector region 24", is hetero junction epi-region 27 comprising, for example, further collector region 273 (e.g., N-type), intrinsic base region 272 (e.g., P-type) and emitter region 271 (e.g., N-type). Dielectric layer 25 (e.g., of silicon oxide) laterally surrounds hetero junction region 27. Poly semiconductor layer 26 (e.g., of P+silicon) overlies dielectric layer 25 and provides an extrinsic base contact. Base contact transition region 261 couples extrinsic base contact 26 to intrinsic base region 272. Dielectric layers 29 (e.g., silicon oxide) and 30 (e.g., silicon nitride) including sidewalls 31 (e.g., silicon nitride) separate extrinsic base contact 26 (e.g., P+poly-silicon) from emitter contact 28 (e.g., N+poly-silicon). Due to the high doping levels used in regions 261 and 273 for high frequency devices, a substantial portion of base-collector junction capacitance Cjc arises where base contact transition region 261 is in contact with or in close proximity to collector region 24', 24" at the periphery of intrinsic base region 272. The base-collector junction capacitance Cjc is a principal component of the base-collector coupling capacitance Cbc of device 20 of FIG. 1. It is desired to minimize Cjc and thereby also minimize Cbc. To distinguish Cjc and Cbc of device 20 of FIG. 1 from analogous capacitances in other devices and illustrations, the convention is adopted of henceforth referring to Cjc and Cbc of device 20 of FIG. 1 as $(Cjc)_{20}$ and $(Cbc)_{20}$. Capacitances Cjc and Cbc of other devices follow the same convention, that is, $(Cjc)_{40}$ and $(Cbc)_{40}$ for device 40 of FIG. 2, $(Cjc)_{100}$ and $(Cbc)_{100}$ for device 100 of FIG. 10 and $(Cjc)_{100'}$ and $(Cbc)_{100'}$ for device 100' of FIG. 18.

Figure 2:
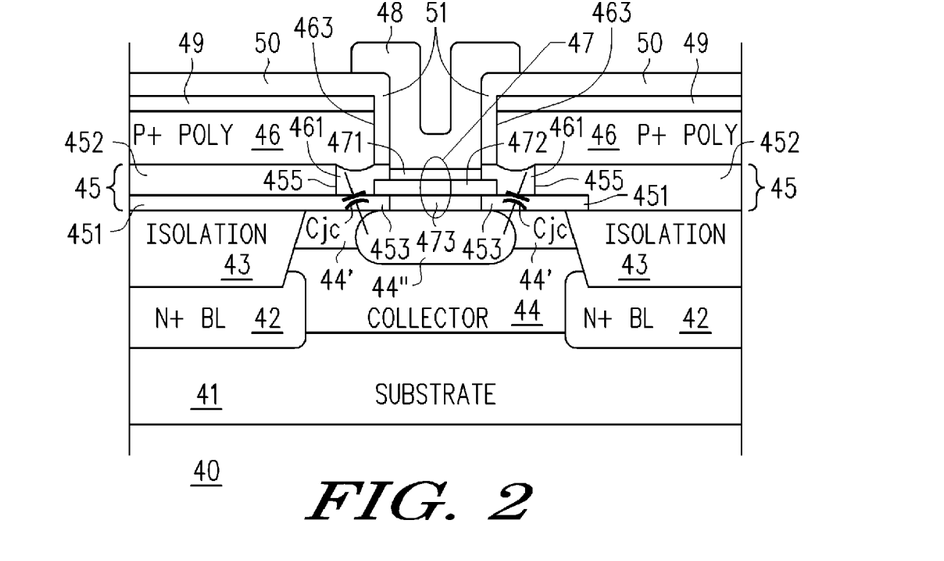
FIG. 2 shows a simplified schematic cross-sectional view of a hetero-junction bipolar transistor illustrating how the undesirable base-collector coupling capacitance Cjc of FIG. 1 can be reduced, according to an embodiment of the present invention, by providing a dielectric ledge underneath the region where the periphery of the intrinsic base region is coupled to the extrinsic base contact.

FIG. 2 shows a simplified schematic cross-sectional view of hetero-junction bipolar transistor 40 according to an embodiment of the present invention, illustrating how undesirable base-collector junction capacitance $(Cjc)_{20}$ and coupling capacitance $(Cbc)_{20}$ of FIG. 1 can be minimized by providing dielectric ledge 453 underneath transition region 461 where the periphery of intrinsic base region 472 is coupled to extrinsic base contact 46 by transition region 461. Stated another way, according to the embodiments of the present disclosure, transition region 461 does not significantly interface with or contact underlying collector regions 44', 44", but is substantially separated therefrom via dielectric ledge 453, as discussed further herein. For convenience of explanation, transistor 40 and later described devices 100, 100', are presumed to be silicon npn-transistors and various semiconductor regions within such devices are identified by way of example based on this assumption. However, this is not intended to be limiting and persons of skill in the art will understand that by appropriate substitution of semiconductor (SC) regions of opposite conductivity type and/or use of silicon or other semiconductor materials, that pnp and other types of semiconductor devices can be provided according to the teaching herein on silicon or other semiconductor substrates. Transistor 40 comprises substrate 41 (e.g., P-type silicon) in which are N+buried layer (BL) regions 42, dielectric isolation regions 43 and N-type collector regions 44, 44', 44", analogous to elements or regions 21, 22, 23, 24, 24', 24' of FIG. 1. Above collector region 44", is hetero junction epi-region 47 analogous to region 27 of FIG. 1 and comprising further collector region 473 (e.g., N-type), intrinsic base region 472 (e.g., P-type) and emitter region 471 (e.g., N-type), analogous to regions 273, 272, 271 of FIG. 1. Dielectric layer 45 (e.g., of oxide, nitride or a combination thereof) substantially laterally surrounds hetero-junction region 47, and includes at least two layer portions 451, 452 and dielectric ledge 453, as discussed further herein. Poly layer 46 (e.g., P+) overlies dielectric layer 45 and provides the extrinsic base contact. Base contact transition region 461 couples extrinsic base contact 46 to intrinsic base region 472. Dielectric layers 49 (e.g., oxide) and 50 (e.g., nitride) including sidewalls 51 (e.g., nitride) separate extrinsic base contact 46 (e.g., P+) from emitter contact 48 (e.g., N+). Regions or layers 41, 42, 43, 44, 44', 44", 45, 46, 461, 47, 471, 472, 473, 48, 49 and 50 of FIG. 2 are generally analogous to layers or regions 21, 22, 23, 24, 24', 24", 25, 26, 261, 27, 271, 272, 273, 28, 29 and 30 of FIG. 1, except as discussed herein with respect to the embodiments of the present disclosure.

Device 40 of FIG. 2 differs from device 20 of FIG. 1 in that dielectric layer 25 of FIG. 1 has been replaced by dielectric multi-layer 45 of FIG. 2 having, for example, portions 451, 452 desirably with different etching properties. Portion 452 of layer 45 is etched back laterally to location 455, so that base contact transition region 461 analogous to region 261 of FIG. 1 can be formed around intrinsic base 472 and beneath proximate interior end 463 of extrinsic base contact 46, thereby bridging between extrinsic base contact 46 and intrinsic base region 472. Portion 451 of layer 45 forms dielectric ledge 453 that underlies base contact transition region 461, thereby preventing it from coming in contact with or in close proximity to collector portion 44". Portion 451 may underlie substantially all of dielectric layer 452, as is illustrated for example in the left half of FIG. 2, or be a localized layer, as is illustrated for example in the right half of FIG. 2 where it underlies dielectric layer 452 only around hetero-epi region 47. Either arrangement is useful. What is desirable is that portions 453 (i.e., "dielectric ledge" 453) of layer 451 separate base contact transition region 461 from collector region 44', 44". In further embodiment, dielectric layer 45 may be a multi-layer having more than two dielectrics with different etching and dielectric properties. In a preferred embodiment, dielectric ledge 453 is a composite layer of, for example, silicon nitride and silicon oxide. This is unlike device 20 of FIG. 1 wherein base contact transition region 261 circumferentially contacts collector region 24', 24". It is desirable that dielectric ledge 453 is formed of a relatively low dielectric constant material that is thick enough so that the dielectric coupling capacitance between base contact transition region 461 and collector regions 44',44" through dielectric ledge 453 in device 40 is lower than the junction capacitance between base contact transition region 261 and collector regions 24', 24" of device 20. Because of the presence of dielectric ledge 453 between base contact transition region 461 and collector region 44', 44", $(Cbc)_{40}$ of device 40 of FIG. 2 can be made substantially smaller than $(Cbc)_{20}$ of device 20 of FIG. 1. This is highly desirable.

FIGS. 3-10 show simplified schematic cross-sectional views of semiconductor device 100 at various manufacturing stages 203-210, according to further embodiments of the present invention. It should be understood that semiconductor device 100 is merely exemplary and that the present invention may be manufactured using many different methods not specifically depicted or otherwise disclosed herein. Referring now to manufacturing stage 203 of FIG. 3, device 100 can include semiconductor substrate 41. In one embodiment, substrate 41 can comprise a p-type bulk silicon wafer or an n-type bulk silicon wafer. In a different embodiment, substrate 41 can comprise a different semiconductor material such as silicon-germanium, germanium, gallium arsenide, other III-V compounds, II-VI compounds, and other semiconducting materials both inorganic and organic, and combinations thereof. In another embodiment, substrate 41 can be a semiconductor-on-insulator (SOI) wafer having, for example, a first semiconductor layer, a second semiconductor layer, and an electrical insulator layer located between the first and second semiconductor layers. As used herein, the terms "substrate" and "substrate 41" are intended to include all such variations and combinations.

In one embodiment, by way of example for forming an npn device and not intended to be limiting, substrate 41 is, a p-type substrate and includes a heavily doped n-type region 42 (e.g., a buried layer (BL) region), a less-heavily doped n-type collector region 44, and a moderately-doped n-type region 44'. Regions 42, 44, 44' will eventually form part of or be coupled to the collector region of bipolar transistor 100. The methods of forming regions 42, 44, 44' (and region 44" of FIG. 8) in substrate 41 are well-known in the art and will not be further described herein. Isolation region 43, preferably of a dielectric material, is formed in or on a portion of substrate 41 and can be provided before forming regions 42, 44, 44', during their formation or after their formation. By way of example and not intended to be limiting, region 43 can be formed using a shallow trench isolation (STI) method or a local oxidation of silicon (LOCOS) method. Before or after formation of isolation region 43 and regions 42, 44, 44', dielectric multi-layer 45 having, for example, lower portion or layer 451 of thickness 4511 and upper portion or layer 452 of thickness 4521, is formed over surface 411 of semiconductor (SC) substrate 41. Dielectric multi-layer 45 is desirably an electrical insulating layer and can be formed by any number of well known techniques. Non-limiting examples are: growing a thermal oxide, depositing an insulating material such as oxide, nitride and/or oxy-nitride or other dielectric materials by chemical vapor deposition (CVD) or other methods, depositing an oxide formed using TEOS (tetra-ethyl-orthosilicate) or other reactants, sputtering or evaporation of oxides, nitrides, oxy-nitrides and/or other dielectric material, or growing and/or depositing a combination of insulating materials comprising one or more of any of the previously listed dielectric materials and other dielectric materials, using any of these preparation techniques. Silicon oxide and silicon nitride are non-limiting examples of materials useful for dielectric multi-layer 45. For the embodiment being currently described, silicon nitride is preferred for layer 451 and silicon oxide is preferred for layer 452. Thickness 4511 of layer 451 is usefully in the range of about 10 to 100 nanometers, more conveniently about 20 to 80 nanometers and preferably about least about 40 nanometers but thicker or thinner layers can also be used depending upon the desired device properties. Thickness 4521 of layer 452 is usefully in the range of about 10 to 120 nanometers, more conveniently about 40 to 100 nanometers and preferably about 75 nanometers but thicker or thinner layers can also be used depending upon the desired device properties. Polycrystalline SC layer 46 is then formed over layer 45. For an npn device, Poly-layer 46 is desirably P+doped. Thickness 465 is usefully in the range of about 20 to 200 nanometers, more conveniently about 50 to 150 nanometers and preferably about 120 nanometers but thicker or thinner layers can also be used depending upon the desired device properties. Layer 49 of thickness 491 of, for example, silicon oxide is formed over poly-layer 46. Thickness 491 is usefully in the range of about 5 to 100 nanometers, more conveniently about 10 to 30 nanometers and preferably about 15 nanometers but thicker or thinner layers can also be used depending upon the desired device properties. Layer 50 of thickness 501 of, for example silicon nitride, is desirably formed over layer 49. Thickness 501 is usefully in the range of about 20 to 150 nanometers, more conveniently about 40 to 100 nanometers and preferably about 70 nanometers but thicker or thinner layers can also be used depending upon the desired device properties. Layer 52 of thickness 521 of, for example, silicon oxide, is desirably formed over layer 50. Thickness 521 is usefully in the range of about 5 to 100 nanometers, more conveniently about 10 to 30 nanometers and preferably about 15 nanometers but thicker or thinner layers can also be used depending upon the desired device properties. Layer 56 of thickness 561 of, for example silicon nitride, is desirably formed over layer 52. Thickness 561 is usefully in the range of about 5 to 80 nanometers, more conveniently about 10 to 40 nanometers and preferably about 20 nanometers but thicker or thinner layers can also be used depending upon the desired device properties. Layer 58 of thickness 581 of, for example, silicon oxide, is desirably formed over layer 56. Thickness 581 is usefully in the range of about 5 to 100 nanometers, more conveniently about 10 to 30 nanometers and preferably about 15 nanometers but thicker or thinner layers can also be used depending upon the desired device properties. Structure 303 results. In another embodiment, layer 45 comprises a multi-layer dielectric stack, for example, by adding an oxide layer (not shown) underneath nitride layer 451. Dielectric ledge 453 can therefore comprise a stack of different dielectric materials. In a still further embodiment, layers 56, 58 may be omitted. For convenience of explanation it is assumed hereafter in connection with FIGS. 3-5 that layers 56, 58 are included.

Figure 4:
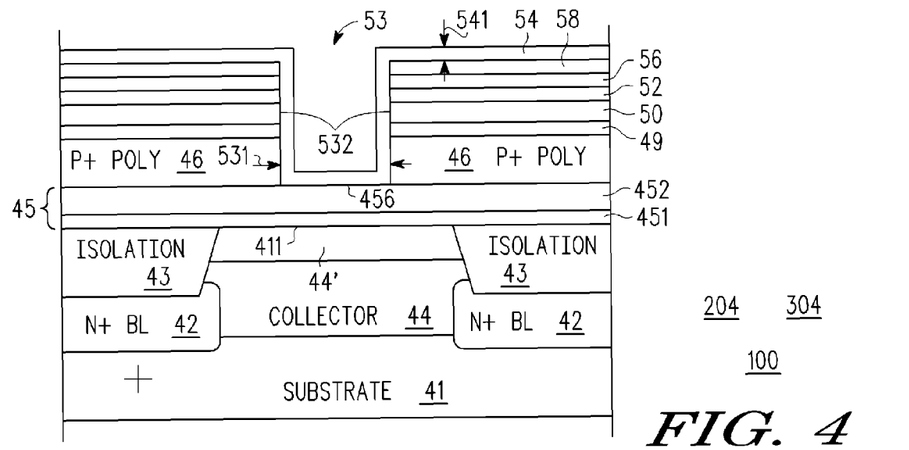

In manufacturing stage 204 of FIG. 4, structure 303 is masked (e.g., using photo-resist) and trench 53 of lateral extent 531 etched through layers 46, 49, 50, 52, 56, and 58 to expose central portion 456 of layer 45. Means for etching such layers are well known in the art and are not described further herein. Anisotropic etching is preferred. Layer 54 of thickness 541 is then desirably conformally deposited or otherwise formed over the remaining parts of layer 58, on sides 532 of trench 53 and on exposed central portion 456 of layer 45 in trench 53.

Layer 54 is desirably of silicon nitride, but other dielectric materials may also be used. Thickness 541 is usefully in the range of about 5 to 80 nanometers, more conveniently about 10 to 40 nanometers and preferably about 20 nanometers but thicker or thinner layers can also be used depending upon the desired device properties. Structure 304 results. In manufacturing stage 205 of FIG. 5, layer 54 is desirably anisotropically etched so as to remove the portions of layer 54 overlying layer 58 laterally outside of trench 53 and remove central portion 456 within trench 53', thereby leaving sidewall portions 542. Sidewall portions 542 form lateral spacers 51 of FIG. 2 and will henceforth be referred to as such. Trench 53' corresponds to trench 53 but of width reduced by twice thickness 511 of sidewall spacers 51. Thickness 511 of sidewall spacers 51 corresponds substantially to thickness 541 of layer 54. Structure 305 results.

Figure 6:
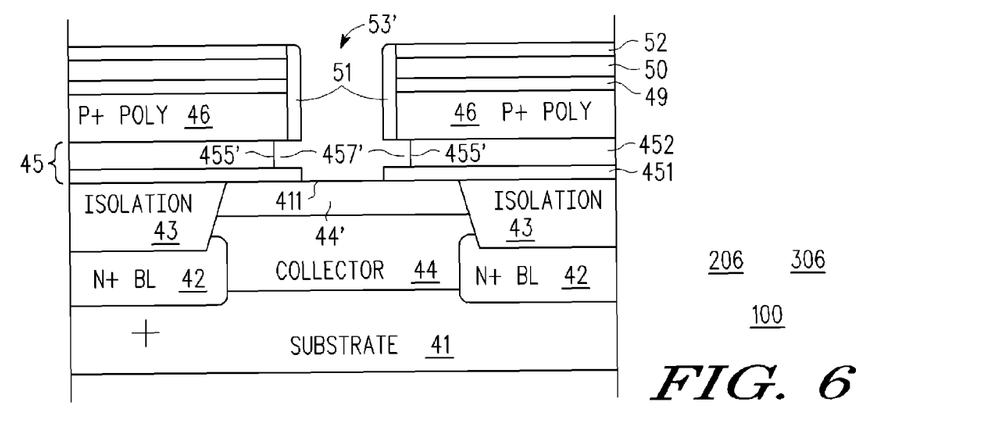
Figure 7:
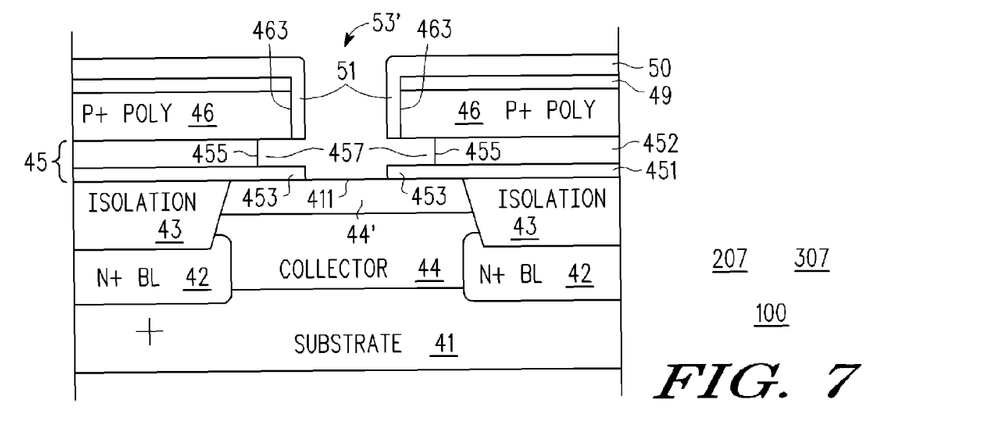
Figure 8:
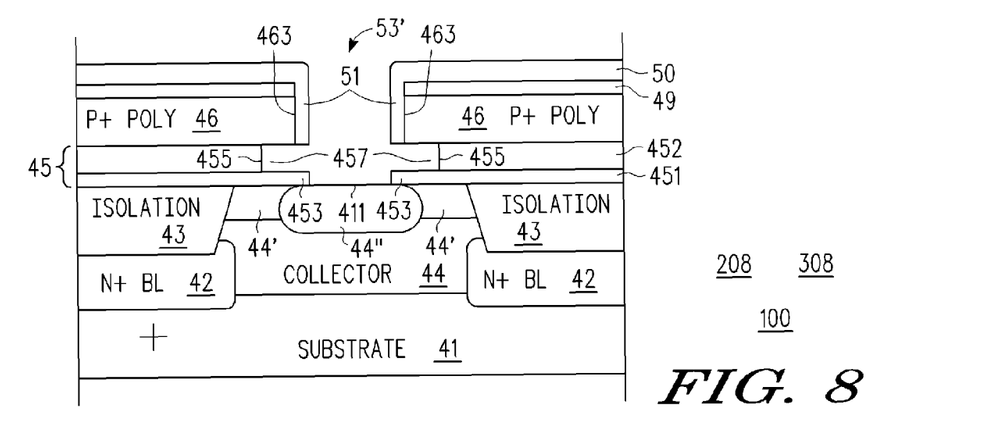

In manufacturing stage 206 of FIG. 6, central portion 456 of dielectric multi-layer 45 is etched to locally expose surface 411 of SC substrate 41 in trench 53'. Isotropic etching using hydrofluoric acid (HF) solution of layer 452 in trench 53' followed by anisotropic etching of layer 451 in trench 53' is preferred. The isotropic etching also preferably removes layer 58, while the anisotropic etching also preferably removes layer 56, the top portion of spacer 51, and may or may not also remove part of layer 52. Anisotropic etching may also be used. Either arrangement is useful. The isotropic etching can also partially laterally etch layer 452 to produce cavity 457' extending to location 455' underneath spacer 51 and poly-layer 46. Structure 306 results. In manufacturing stage 207 of FIG. 7, portions of layer 452 underlying poly-layer 46 are further laterally etched back to location 455 to provide lateral undercut cavity 457. Isotropic etching is useful for this purpose. It is desirable that the reagent used for etching layer 452 during manufacturing stages 206-207 not significantly attack layer 451, thereby forming dielectric ledges 453 underlying proximate ends 463 of poly-layer (extrinsic base contact) 46 adjacent trench 53'. Cavity 457 may be formed by isotropic etches during either or both manufacturing stages 206 and 207. Any remaining part of layer 52 is also removed in this stage. Structure 307 results. In manufacturing stage 208, more heavily doped collector region 44" is formed beneath surface 411 in trench opening 53'. Ion implantation is a convenient method for forming region 44" but other doping techniques may also be employed in other embodiments. Collector region 44" can in some further embodiments, also extend into collector region 44. In other embodiments, more heavily doped layer 44" may be formed earlier, or excluded altogether. If layer or region 44" is omitted, then layer 44' may be more heavily doped. Structure 308 results.

Figure 9:
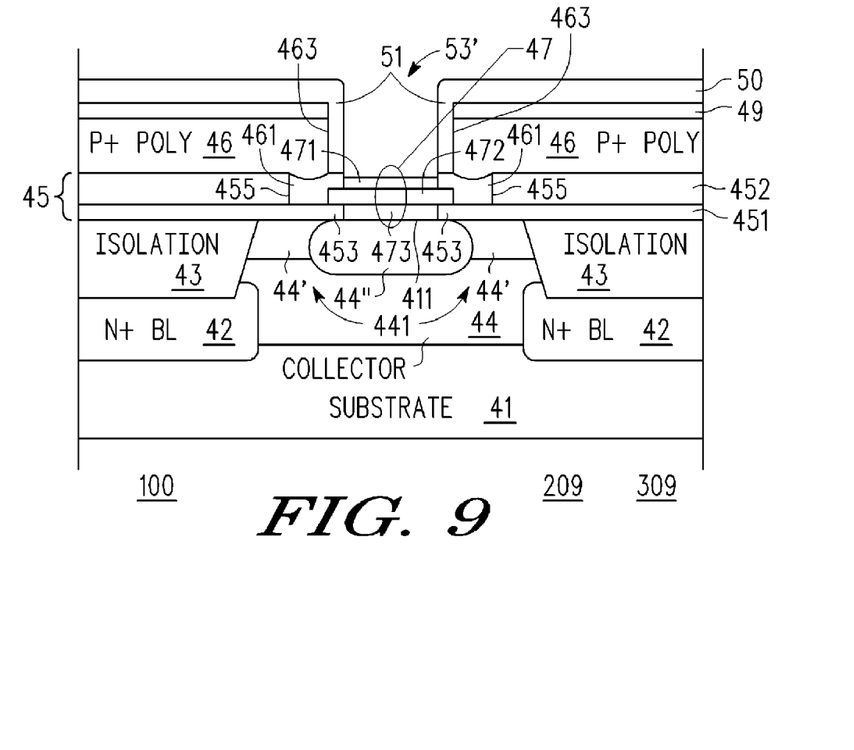
Figure 10:
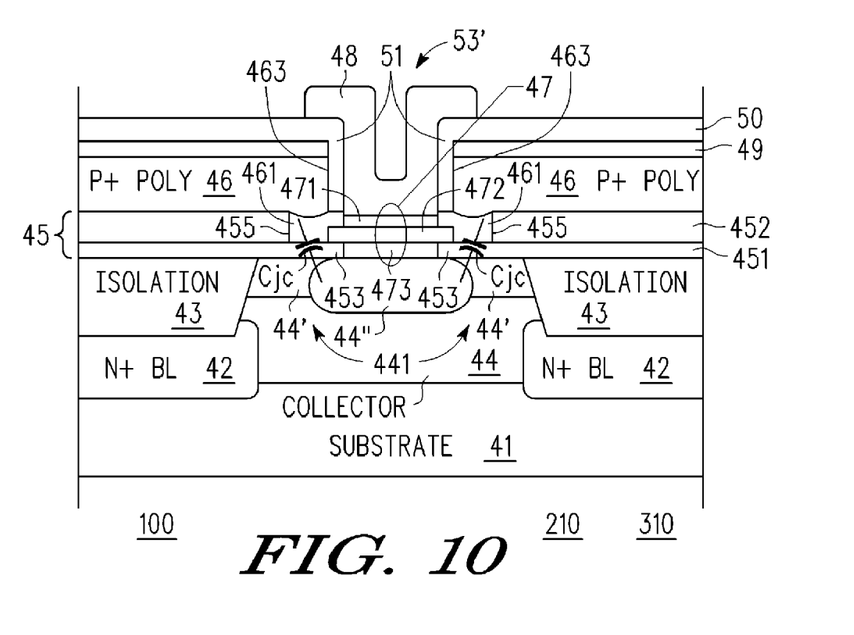
Figure 11:
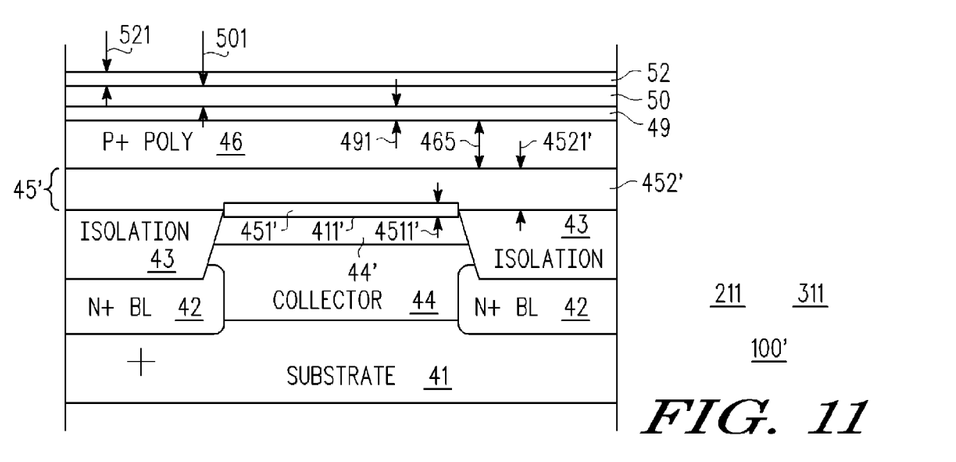
FIGS. 11-18 show simplified schematic cross-sectional views of a portion of a semiconductor device analogous to FIG. 2 at various stages of manufacture according to still further embodiments of the present invention.

In manufacturing stage 209 of FIG. 9, hetero junction epi-region 47 is formed on surface 411 in trench 53' using means well known in the art. In one embodiment, region 47 can be a composite epitaxial layer. As a non-limiting example, region 47 can formed by the process of: (a) growing a silicon epitaxial layer 473 over surface 411; (b) growing a SiGeC (silicon-germanium-carbon) epitaxial layer 472 over layer 473; and (c) growing a silicon epitaxial layer 471 over layer 472. In this embodiment, only layer 471 can be doped or all three layers 471, 472, and 473 can be doped. In other embodiments, epi-region 47 can be a composite epitaxial layer formed by a combination of silicon, silicon germanium (SiGe), SiGeC, or other epitaxial semiconductor materials. Furthermore, transition region 461 of enhanced doping in contact with proximate end 463 of layer (extrinsic base contract) 46 is desirably formed during the formation of epi-region 47. In one embodiment, transition region 461 is a poly-crystalline region formed during the formation of epi-region 47 and doped by diffusion from polycrystalline layer (extrinsic base contract) 46. In another embodiment, transition region 461 is a portion of region 47, which is doped by diffusion from layer 472. Hetero junction epi-region 47 comprises collector region 473 in contract with collector region 44", intrinsic base region 472 and emitter region 471 in a stack like arrangement. In the course of growing epi-region 47, base contact transition region 461 substantially fills in cavity 457 of FIG. 8 so as to electrically couple intrinsic base region 472 to extrinsic base contact 46. Intrinsic base region 472 is generally high quality single crystal. Since extrinsic base contact 46 is conveniently poly, base contact transition region 461 provides a buffer region between single crystal intrinsic base region 472 and polycrystalline layer (extrinsic base contact) 46. Transition region 461 can also generally be more highly doped than intrinsic base region 472 by out-diffusion of dopant from highly doped extrinsic base contact 46. Structure 309 results. In manufacturing stage 210 of FIG. 10, emitter contact 48 (e.g., of N+doped poly-silicon) is provided extending into trench 53' to make contact to emitter region 471. Structure 310 and device 100 results. Because dielectric ledge 453 forms a low dielectric capacitance between base contact transition region 461 and the collector region 44', 44", capacitance $(Cbc)_{100}$ of device 100 of FIG. 10 is much reduced compared to $(Cbc)_{20}$ of device 20 FIG. 1, as discussed further herein, with respect to the efficacy of the methods and structures of the devices of FIGS. 3-10 in reducing $(Cbc)_{100}$ compared to $(Cbc)_{20}$. This is highly desirable.

FIGS. 11-18 show simplified schematic cross-sectional views of a portion of semiconductor device 100' at various stages of manufacture 211-218 according to still further embodiments of the present invention. It should be understood that semiconductor device 100' is merely exemplary and that the present invention may be manufactured using many different methods not specifically depicted or otherwise disclosed herein. In FIGS. 11-18, like reference numbers are used to refer to like layers, regions and thicknesses as in FIGS. 3-10 and the discussion thereof in connection with FIGS. 3-10 is incorporated herein by reference. Referring now to manufacturing stage 211 of FIG. 11, device 100' can include semiconductor substrate 41. By way of example for forming an npn device and not intended to be limiting, substrate 41 is, a p-type substrate and includes a heavily doped n-type region 42 (e.g., a buried layer (BL) region), a less-heavily doped n-type collector region 44, and a moderately-doped n-type region 44'. Regions 42, 44, 44' will eventually form part of or be coupled to the collector region of bipolar transistor 100'. The methods of forming regions 42, 44, 44' (and region 44" of FIG. 16) in substrate 41 are well-known in the art and will not be further described herein. Isolation region 43, preferably of a dielectric material, is formed in or on a portion of substrate 41 and can be provided before forming regions 42, 44, 44', during their formation or after their formation. Before or after formation of isolation region 43 and regions 42, 44, 44', dielectric double-layer 45' is formed over surface 411 of semiconductor (SC) substrate 41.

Figure 3:
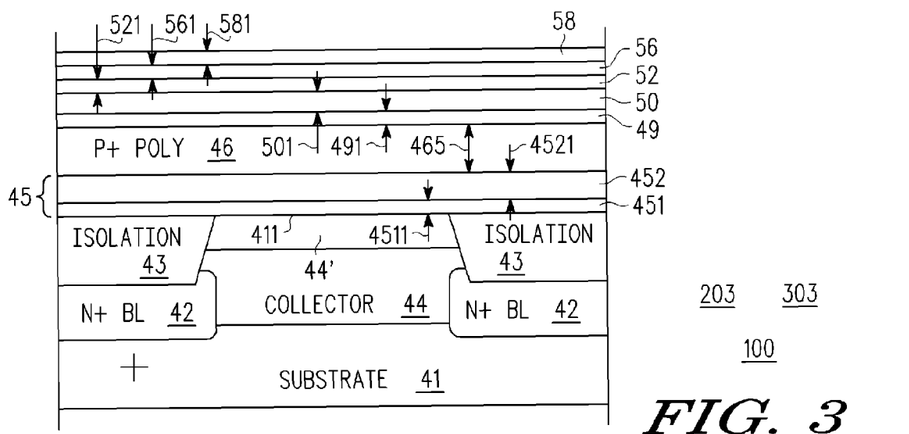
FIGS. 3-10 show simplified schematic cross-sectional views of a portion of a semiconductor device analogous to FIG. 2 at various stages of manufacture according to further embodiments of the present invention.
Figure 5:
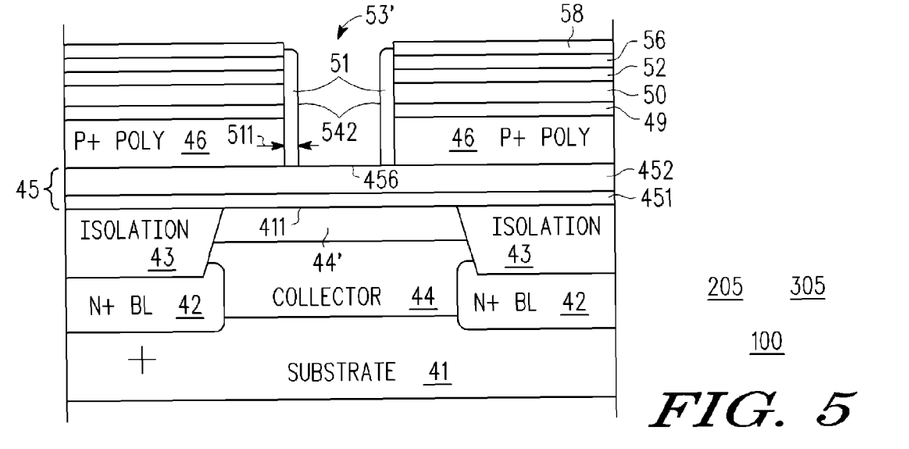

Dielectric double-layer 45' desirably has two portions, portion 451' on surface 411' of SC substrate 41 and portion 452' overlying portion 451' and also extending over isolation regions 43. Dielectric double-layer 45' is desirably an electrical insulating layer with a low dielectric capacitance and can be formed by any number of well known techniques. Non-limiting examples are: growing a thermal oxide, depositing an insulating material such as oxide, nitride and/or oxy-nitride or other dielectric materials by chemical vapor deposition (CVD) or other methods, depositing an oxide formed using TEOS (tetra-ethyl-ortho-silicate) or other reactants, sputtering or evaporation of oxides, nitrides, oxy-nitrides and/or other dielectric material, or growing and/or depositing a combination of insulating materials comprising one or more of any of the previously listed dielectric materials and other dielectric materials, using any of these preparation techniques. Silicon oxide and silicon nitride are non-limiting examples of materials useful for dielectric double layer 45'. For the embodiment being currently described, thermally grown silicon oxide is preferred for portion 451' and CVD silicon oxide is preferred for portion 452'. Thickness 4511' of portion 451' is usefully in the range of about 5 to 100 nanometers, more conveniently about 10 to 80 nanometers and preferably at least about 20 nanometers but thicker or thinner layers can also be used depending upon the desired device properties. Oxide layer 451' of FIGS. 11-13 has a lower dielectric constant than nitride layer 451 of FIGS. 3-10. Hence, layer 451' may be made thinner than layer 451 for the same Cbc. Alternatively, for the same dielectric ledge 453, 453' thickness, layer 451' will provide lower coupling capacitance Cbc. Thickness 4521' of portion 452' is usefully in the range of about 20 to 120 nanometers, more conveniently about 40 to 100 nanometers and preferably about 75 nanometers but thicker or thinner layers can also be used depending upon the desired device properties. Oxide region 452' is preferably formed using TEOS. Polycrystalline SC layer 46 is then formed over layer 45'. Layer 49 of thickness 491 of, for example, silicon oxide is formed over poly-layer 46. Layer 50 of thickness 501 of, for example silicon nitride, is desirably formed over layer 49. Layer 52 of thickness 521 of, for example, silicon oxide, is desirably formed over layer 50. Thicknesses 461, 491, 501, and 521 are generally as described in connection with FIGS. 3-10. Layers akin to layers 56 and 58 in FIGS. 3-5 are desirably omitted in this embodiment. Structure 311 results.

Figure 12:
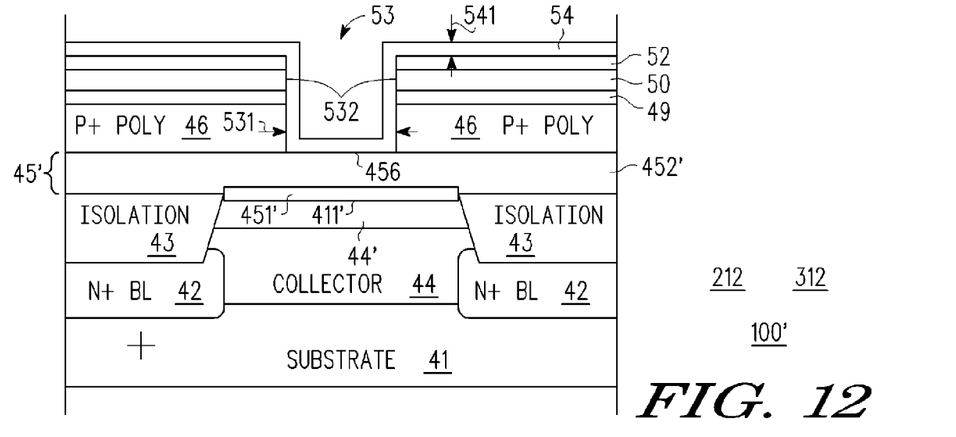
Figure 13:
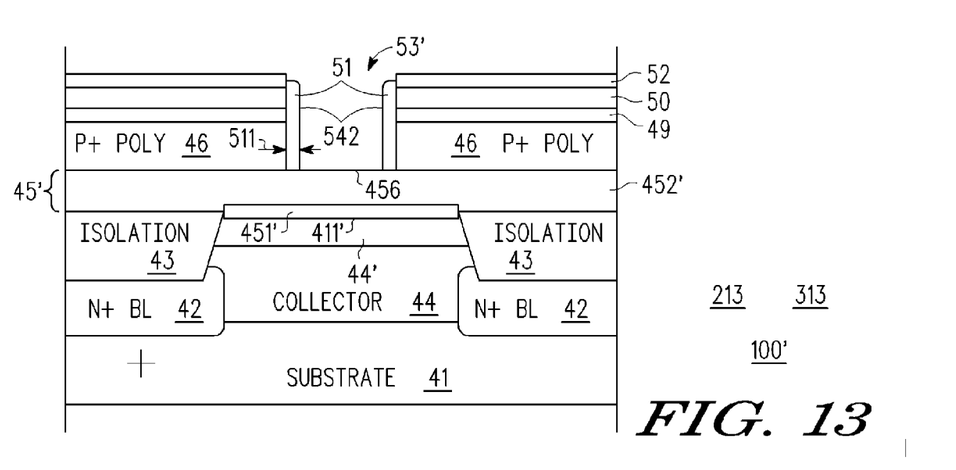

In manufacturing stage 212 of FIG. 12, structure 311 is masked (e.g., using photo-resist) and trench 53 of lateral extent 531 etched through layers 46, 49, 50, and 52 to expose central portion 456 of layer 45, in generally the same manner as has already been described in connection with FIGS. 3-10. Layer 54 of thickness 541 (already described) is then desirably conformally deposited or otherwise formed over the remaining parts of layer 52, on sides 532 of trench 53 and on exposed central portion 456 of layer 452' in trench 53. Layer 542' is desirably of silicon nitride, but other dielectric materials may also be used. Structure 312 results. In manufacturing stage 213 of FIG. 13, layer 54 is desirably anisotropically etched so as to remove the portions of layer 54 overlying layer 52 laterally outside of trench 53 and remove central portion 456 within trench 53', thereby leaving sidewall portions 542. Sidewall portions 542 form lateral spacers 51 of FIG. 13 and will henceforth be referred to as such. Trench 53' corresponds to trench 53 but of width reduced by twice thickness 511 of sidewall spacers 51. Thickness 511 of sidewall spacers 51 corresponds substantially to thickness 541 of layer 54. Structure 313 results.

Figure 14:
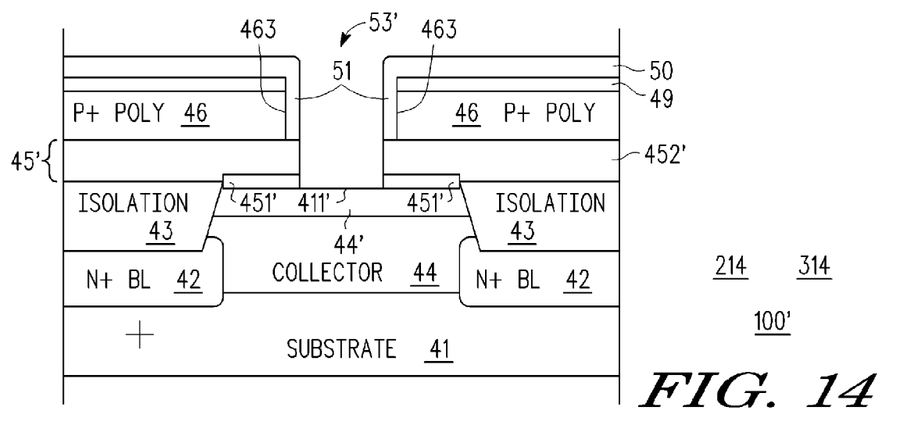
Figure 15:
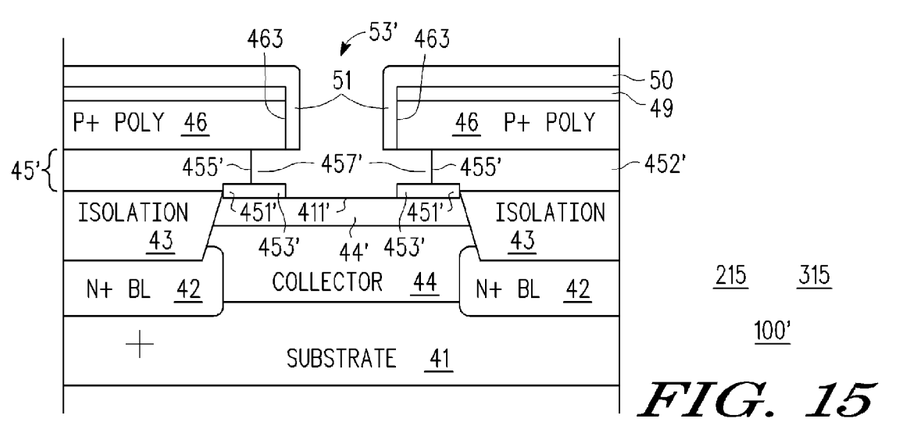
Figure 16:
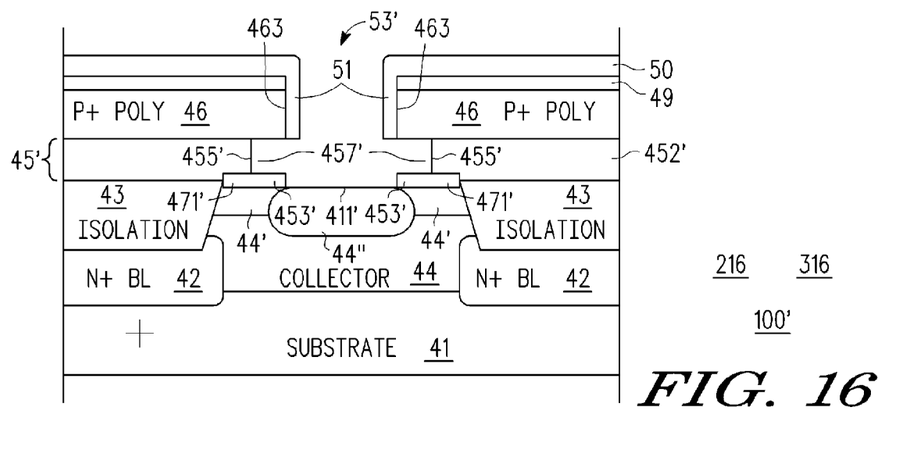
Figure 17:
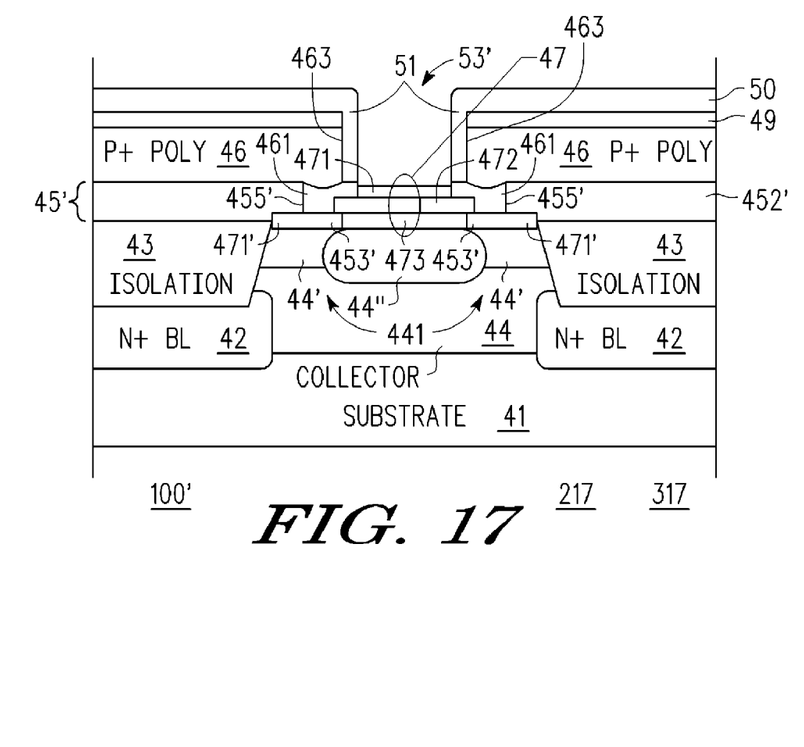
Figure 18:
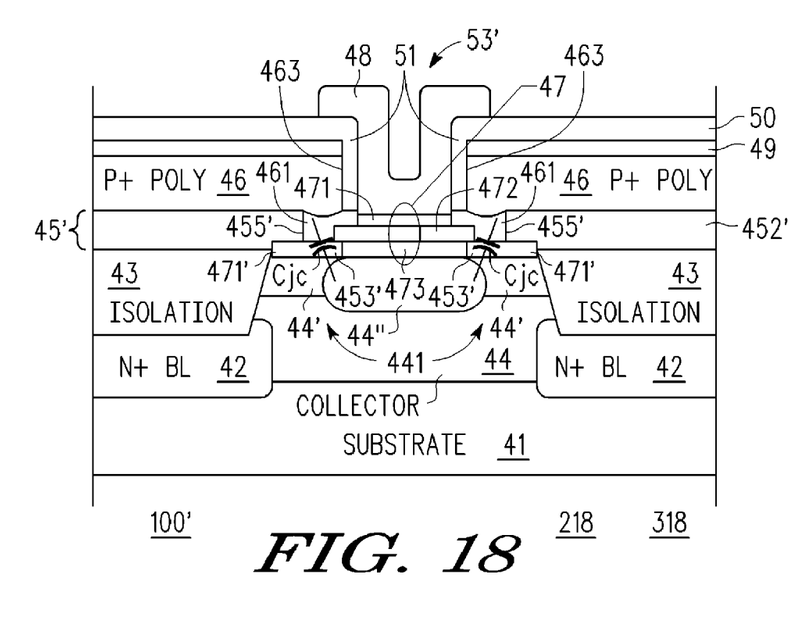

In manufacturing stage 214 of FIG. 14, central portion 456 of dielectric double-layer 45' is etched to locally expose surface 411' of SC substrate 41 in trench 53'. Anisotropic etching is preferred. This generally also removes the remaining portions of layer 52 laterally outside of trench 53' and may or may not also remove part of layer 50. Either arrangement is useful. Structure 314 results. In manufacturing stage 215 of FIG. 15, parts of layer 452' underlying poly-layer 46 are laterally etched back to location 455' to provide undercut cavity 457'. Isotropic etching using hydrofluoric acid (HF) solution is useful for this purpose. Because portion 451' is preferably formed of thermal oxide and portion 452' is preferably formed of TEOS CVD oxide, the latter etches back much more rapidly in HF then portion 451', thereby forming dielectric ledges 453' from the remaining parts of portion 451' underlying proximate ends 463 of poly-layer (extrinsic base contact) 46 adjacent trench 53'. Structure 315 results. In an alternate embodiment, the anisotropic etching of manufacturing stage 214 may be skipped. In this case, the isotropic HF etch in manufacturing stage 215 removes layer 52, laterally outside of trench 53', central portion 456 of dielectric multi-layer-layer 45' (exposing surface 411' of SC substrate 41 in trench 53'), as well as parts of layer or portion 452' underlying poly-layer 46 which are laterally etched back to location 455' to provide undercut cavity 457'. In manufacturing stage 216, more heavily doped collector region 44" is formed beneath surface 411' in trench opening 53'. Ion implantation is a convenient method for forming region 44" but other doping techniques may also be employed in other embodiments. Collector region 44" can in some further embodiments, also extend into collector region 44. In another embodiment, more heavily doped region 44" may be formed earlier or omitted altogether. In this case, region or layer 44' may be more heavily doped. Structure 316 results. In manufacturing stage 217 of FIG. 17, hetero junction epi-region 47 is desirably formed on surface 411' in trench 53' in the same manner and for the same purpose as described in connection with FIGS. 3-11. Hetero-junction epi-region 47 comprises collector region 473 in contract with collector region 44", intrinsic base region 472 and emitter region 471 in a stack like arrangement. In the course of growing epi-region 47, base contact transition region 461 forms in cavity 457' so as to electrically couple intrinsic base region 472 to extrinsic base contact 46. Structure 317 results. In manufacturing stage 218 of FIG. 18, emitter contact 48 (e.g., of N+doped poly-silicon) is provided extending into trench 53' to make contact to emitter region 471. Structure 318 and device 100' result. Because dielectric ledge 453' forms a low dielectric capacitance between base contact transition region 461 and the collector region 44', 44", capacitance $(Cbc)_{100'}$ of device 100' of FIG. 18 is much reduced compared to $(Cbc)_{20}$ of device 20 FIG. 1, as discussed further herein, with respect to the efficacy of the methods and structures of the devices of FIGS. 11-18 in reducing $(Cbc)_{100'}$, compared to $(Cbc)_{20}$. This is highly desirable.

The efficacy of the methods and structures of the devices of FIGS. 2-18 in reducing $(Cbc)_{40}$, $(Cbc)_{100}$, and $(Cbc)_{100'}$ of devices 40, 100, and 100' compared to $(Cbc)_{20}$ of device 20 of FIG. 1 have been evaluated by simulation. First, the contribution of the peripheral base-collector coupling capacitance Cbc to the total base-collector coupling capacitance was determined and found to be about the largest single component of the total base-collector coupling capacitance, that is, about 35-60% of the total base-collector coupling capacitance, the exact amount depending upon the particular junction geometry and doping considered. The change in Cbc was then evaluated, for example, as a function of the thickness of dielectric ledge 453 of the structure of FIGS. 3-11, where layer 452 was of silicon nitride. It was found that for thickness 4511 of layer 451 providing dielectric ledges 453 usefully equal or greater than about 20 nanometers, more conveniently equal or greater than about 30 nanometers and preferably equal or greater than about 40 nanometers, gave 20-30% reduction in Cbc compared to what would be expected for device 20 of FIG. 1. This is a very significant reduction in base-collector coupling capacitance and is expected, by itself, to result in approximately 12-20% increase in $f_{MAX}$, where $f_{MAX}$ is defined as the frequency where the unilateral power gain equals unity. This is also referred to as maximum frequency of oscillation, a power gain figure of merit. This 12-20% increase in $f_{MAX}$ is a very significant improvement in device performance and is believed to make it possible to extend the applicability of silicon based devices into the higher frequency ranges identified earlier and beyond.

Figure 19:
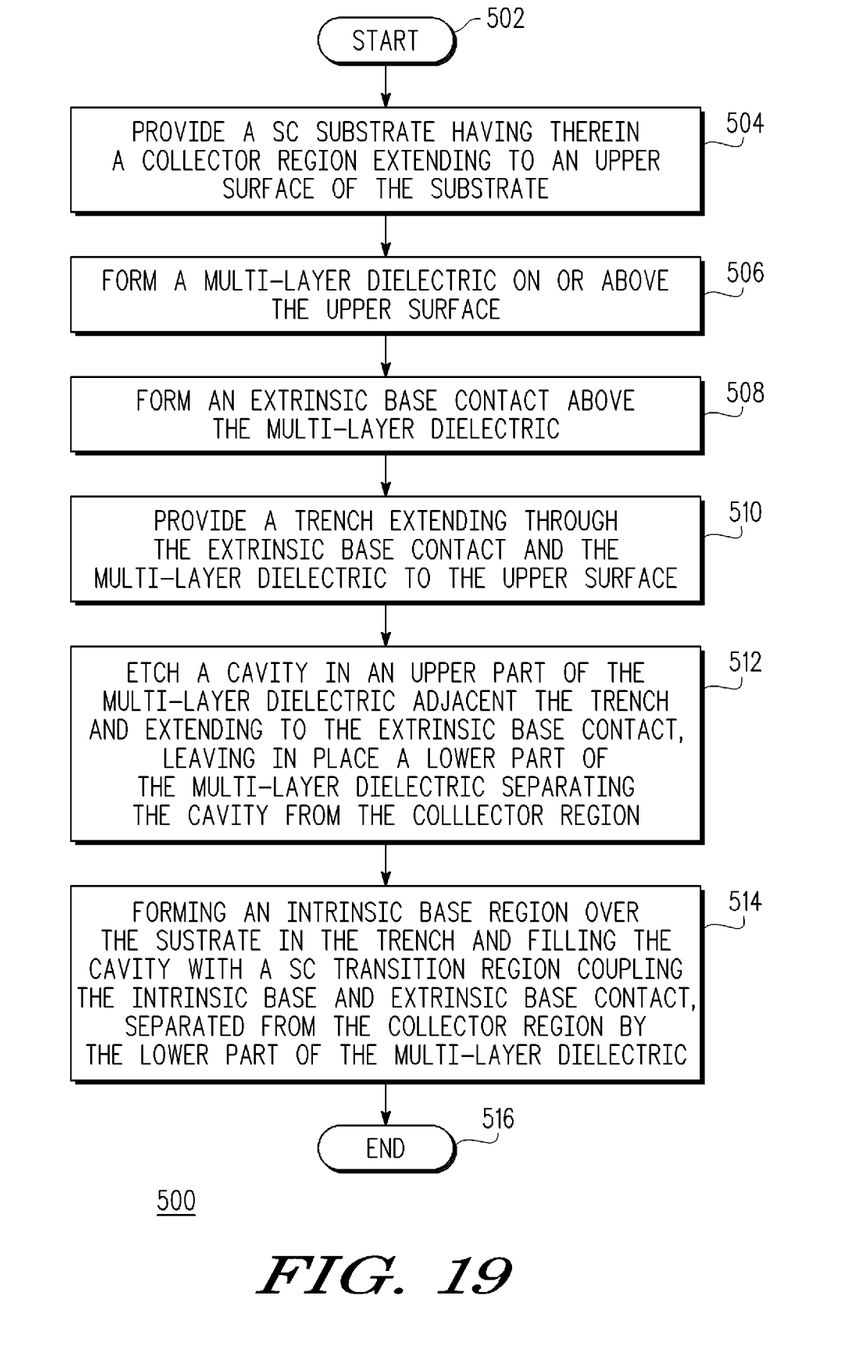
FIG. 19 illustrates a flow chart for a method of manufacturing a semiconductor device having reduced base-collector coupling capacitance according to yet further embodiments of the present invention.

FIG. 19 illustrates a flow chart for method 500 of manufacturing a semiconductor device (e.g., 40, 100, 100') having reduced base-collector coupling capacitance Cbc according to yet further embodiments of the present invention. Method 500 begins with START 502 and initial step 504 wherein semiconductor (SC) substrate 41 is provided having therein a collector region 44, 44' (and 44" in some embodiments) extending to an upper surface 411, 411' of substrate 41. It should be noted that region 44 and/or 44' comprise a "collector region" as that term is used herein and that further collector region 44" may be provided before or after the various other layers are formed on surface 411, 411'. In the embodiments illustrated in FIGS. 3-18, further collector region 44" is provided after trench 53 is formed, but in other embodiments, further collector region 44" may be provided at other stages of the manufacturing process, or not at all. Method 500 is intended to include these and other variations. In method step 506, multi layer dielectric 45, 45' is formed on or above upper surface 411, 411'. In method step 508, extrinsic base contact (layer) 46 is formed above multi-layer dielectric 45, 45'. In method step 510, trench 53 is provided extending through extrinsic base contact (layer) 46 and multi-layer dielectric 45, 45' to upper surface 411, 411' of SC substrate 41. In method step 512, cavity 457, 457' is etched in the upper part (452, 452') of multi-layer dielectric 45 adjacent trench 53 and extending to extrinsic base contact 46, leaving in place lower part 451, 451' of multi-layer dielectric 45 separating cavity 457, 457' from collector region 44, 44' (and 44"). In particular, the lower part 451, 451' of multi-layer dielectric 45 left in place includes ledge 453, 453' as discussed herein. In method step 514, intrinsic base region 472 is formed over substrate 41 in trench 53 and cavity 457, 457' is filled with semiconductor (SC) transition region 461 coupling intrinsic base 472 and extrinsic base contact (layer) 46 and separated from collector region 44, 44' (and 44") by lower part 451, 451' of multi layer dielectric 45. Method 500 then proceeds to END 516.

According to a first embodiment, there is provided a method (500) for forming a semiconductor device (40, 100, 100"), comprising, providing (504) a semiconductor substrate (41) having therein a collector region (44, 44', 44") extending to an upper surface (411, 411') of the substrate (41), forming (506) a multi layer dielectric (45) on or above the upper surface (411, 411'), forming (508) an extrinsic base contact (46) above the multi layer dielectric (45), providing (510) a trench (53) extending through the extrinsic base contact (46) and the multi layer dielectric (45) to the upper surface (411, 411'), etching (512) a lateral cavity (457, 457') in an upper part (452, 252') of the multi layer dielectric (45) adjacent the trench (53) and extending past an end (463) of the extrinsic base contact (46), leaving in place a lower part (451, 451') of the multi layer dielectric (45) separating the cavity (457, 457') from the collector region (44, 44'), and forming (514) an intrinsic base region (472) over the substrate (41) in the trench (53) and filling the cavity (457, 457') with a semiconductor transition region (461) coupling the intrinsic base (472) and the extrinsic base contact (46), and separated from the collector region (44, 44') by the lower part (451, 451') of the multi layer dielectric (45). In particular, the lower part (451, 451') of the multi-layer dielectric (45) left in place includes a ledge (453, 453'). According to a further embodiment, the substrate (41) comprises silicon. According to a still further embodiment, the multi-layer dielectric (45) comprises silicon oxide and silicon nitride. According to a yet further embodiment, the upper (452) and lower (451) parts of the multi-layer dielectric (45) are differentially etchable. According to a still yet further embodiment, the upper part (452) of the multi-layer dielectric (45) comprises an oxide and the lower part (451) of the multi-layer dielectric (45) comprises a nitride. According to a yet still further embodiment, the nitride has a thickness in the range of about 10 to 100 nanometers. According to another embodiment, the nitride has a thickness (451) of at least about 20 nanometers. According to a still another embodiment, the multi-layer dielectric (45) further comprises an oxide layer between the lower part (451) of the multi-layer dielectric (45) and the collector region (44, 44', 44"). According to a yet another embodiment, the lower part (451) of the multi-layer dielectric (45) comprises a first dielectric having a first etch rate and the upper part (452) of the multi-layer dielectric (45) comprises a second dielectric having a second etch rate faster than the first etch rate. According to a still yet another embodiment, the first dielectric is a thermally grown silicon oxide and the second dielectric is a deposited silicon oxide.

According to a second embodiment, there is provided a semiconductor device (40, 100, 100"), comprising, an extrinsic base contact (46), an intrinsic base region (472), a semiconductor transition region (461) coupling the intrinsic base region (472) and the extrinsic base contact (46), a collector region (44, 44', 44") underlying the intrinsic base region (472) and having a periphery (441) underlying the transition region (461), and a dielectric ledge (453, 453') separating the transition region (461) at least from the periphery (441) of the collector region (44, 44', 44"). According to a further embodiment, the dielectric ledge (453, 453') comprises silicon nitride or silicon oxide or a combination thereof. According to a still further embodiment, the dielectric ledge (453, 453') has a thickness in the range of about 5-100 nanometers. According to a yet further embodiment, the dielectric ledge (453, 453') has a thickness of at least 20 nanometers. According to a still yet further embodiment, the dielectric ledge (453, 453') substantially laterally surrounds a semiconductor region (47) containing the intrinsic base region (472).

According to a third embodiment, there is provided a method for forming a semiconductor device (40, 100, 100'), comprising, providing a semiconductor substrate (41), forming an extrinsic base contact (46) above the semiconductor substrate (41) and having a central opening (53, 53') extending to the semiconductor substrate (41), providing an intrinsic base region (472) above the semiconductor substrate (41) in the central opening (53, 53'), forming a semiconductor transition region (461) above the semiconductor substrate (41) extending between the intrinsic base region (472) and the extrinsic base contact (46), providing a collector region (44, 44', 44") in or on the semiconductor substrate (41) underlying the intrinsic base region (472) and having a periphery (441) underlying the transition region (461), and forming a dielectric ledge (453, 453') in or on the semiconductor substrate (41) separating the transition region (461) from at least the periphery (441) of the collector region (44, 44', 44"). According to a further embodiment, the dielectric ledge (453, 453') is formed by differential etching. According to a still further embodiment, the dielectric ledge (453, 453') is formed by differential etching of a nitride dielectric and an oxide dielectric. According to a yet further embodiment, the intrinsic base region (472) is formed by hetero-epitaxial growth in or on the semiconductor substrate (41) in the central opening (53, 53'). According to a still yet further embodiment, the intrinsic base region (472) comprises single crystal semiconductor and the extrinsic base contact (46) comprises poly-crystalline semiconductor and the semiconductor transition region (461) extending between the intrinsic base region (472) and the extrinsic base contact (46) is at least partially doped from the extrinsic base contact (46).

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the various regions or layers described herein may be comprised of many different material and formed by many different methods, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for forming a semiconductor device, comprising:
providing a semiconductor substrate having therein a collector region extending to an upper surface of the semiconductor substrate;
forming a multi layer dielectric on or above the upper surface;

forming an extrinsic base contact above the multi layer dielectric;

providing a trench extending through the extrinsic base contact and the multi layer dielectric to the upper surface;

etching a lateral cavity in an upper part of the multi layer dielectric adjacent the trench and extending past an end of the extrinsic base contact, leaving in place a lower part of the multi layer dielectric separating the lateral cavity from the collector region; and forming an intrinsic base region over the semiconductor substrate in the trench and filling the lateral cavity with a semiconductor transition region coupling the intrinsic base region and the extrinsic base contact, and separated from the collector region by the lower part of the multi layer dielectric.

2. The method for forming a semiconductor device according to claim 1, wherein the semiconductor substrate comprises silicon.

3. The method for forming a semiconductor device according to claim 2, wherein the multi-layer dielectric comprises silicon oxide and silicon nitride.

4. The method for forming a semiconductor device according to claim 1, wherein the upper and lower parts of the multi-layer dielectric are differentially etchable.

5. The method for forming a semiconductor device according to claim 4, wherein the upper part of the multi-layer dielectric comprises an oxide and the lower part of the multi-layer dielectric comprises a nitride.

6. The method for forming a semiconductor device according to claim 5, wherein the nitride has a thickness in the range of about 10 to 100 nanometers.

7. The method for forming a semiconductor device according to claim 5, wherein the nitride has a thickness of at least about 20 nanometers.

8. The method for forming a semiconductor device according to claim 5, wherein the multi-layer dielectric further comprises an oxide layer between the lower part of the multi-layer dielectric and the collector region.

9. A method for forming a semiconductor device, comprising:

providing a semiconductor substrate having therein a collector region extending to an upper surface of the semiconductor substrate;

forming a multi layer dielectric on or above the upper surface, wherein a lower part of the multi-layer dielectric comprises a first dielectric having a first etch rate and an upper part of the multi-layer dielectric comprises a second dielectric having a second etch rate faster than the first etch rate so that the upper and lower parts of the multi-layer dielectric are differentially etchable;

forming an extrinsic base contact above the multi layer dielectric;

providing a trench extending through the extrinsic base contact and the multi layer dielectric to the upper surface;

etching a lateral cavity in an upper part of the multi layer dielectric adjacent the trench and extending past an end of the extrinsic base contact, leaving in place a lower part of the multi layer dielectric separating the lateral cavity from the collector region; and forming an intrinsic base region over the semiconductor substrate in the trench and filling the lateral cavity with a semiconductor transition region coupling the intrinsic base region and the extrinsic base contact, and separated from the collector region by the lower part of the multi layer dielectric.

10. The method for forming a semiconductor device according to claim 9, wherein the first dielectric is a thermally grown silicon oxide and the second dielectric is a deposited silicon oxide.

11. A method for forming a semiconductor device, comprising:

providing a semiconductor substrate;

forming an extrinsic base contact above the semiconductor substrate and having a central opening extending to the semiconductor substrate;

providing an intrinsic base region above the semiconductor substrate in the central opening;

forming a semiconductor transition region above the semiconductor substrate extending between the intrinsic base region and the extrinsic base contact;

providing a collector region in or on the semiconductor substrate underlying the intrinsic base region and having a periphery underlying the semiconductor transition region; and forming a dielectric ledge in or on the semiconductor substrate separating the semiconductor transition region from at least the periphery of the collector region.

12. The method for forming a semiconductor device according to claim 11, wherein the dielectric ledge is formed by differential etching.

13. The method for forming a semiconductor device according to claim 11, therein the dielectric ledge is formed by differential etching of a nitride dielectric and an oxide dielectric.

14. The method for forming a semiconductor device according to claim 11, wherein the intrinsic base region is formed by hetero-epitaxial growth in or on the semiconductor substrate in the central opening.

15. The method for forming a semiconductor device according to claim 11, wherein the intrinsic base region comprises single crystal semiconductor and the extrinsic base contact comprises poly-crystalline semiconductor and the semiconductor transition region extending between the intrinsic base region and the extrinsic base contact is at least partially doped from the extrinsic base contact.

* * * * *